(12) United States Patent
Kita

(10) Patent No.: US 8,193,013 B2
(45) Date of Patent: Jun. 5, 2012

(54) SEMICONDUCTOR OPTICAL SENSOR ELEMENT AND METHOD OF PRODUCING THE SAME

(75) Inventor: Yukihiro Kita, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 17 days.

(21) Appl. No.: 12/632,930

(22) Filed: Dec. 8, 2009

(65) Prior Publication Data
US 2010/0164032 A1   Jul. 1, 2010

(30) Foreign Application Priority Data
Dec. 26, 2008   (JP) .................................. 2008-333026

(51) Int. Cl.
*H01L 31/0232* (2006.01)
(52) U.S. Cl. ................. 438/27; 438/65; 438/68
(58) Field of Classification Search .................. 438/27, 438/65, 68, 462; 257/432, 414, E31.127
See application file for complete search history.

(56) References Cited

U.S. PATENT DOCUMENTS

| 7,253,957 B2 * | 8/2007 | Akram et al. ................. 359/619 |
| 7,696,588 B2 * | 4/2010 | Boettiger et al. ............. 257/432 |

FOREIGN PATENT DOCUMENTS

| JP | 2002-176192 A | 6/2002 |
| JP | 2006-287404 A | 10/2006 |

* cited by examiner

*Primary Examiner* — Roy Potter
(74) *Attorney, Agent, or Firm* — Kubotera & Associates, LLC

(57) ABSTRACT

A method of producing a semiconductor optical sensor element includes the steps of: forming an oxide film on a silicon carbide substrate; forming a gate electrode layer on the oxide film; patterning the gate electrode layer to form a gate electrode; and processing thermally the gate electrode layer or the gate electrode under an oxidation environment. Further, the gate electrode layer or the gate electrode is thermally processed under the oxidation environment at a temperature between 750° C. and 900° C.

15 Claims, 14 Drawing Sheets

SEMICONDUCTOR OPTICAL SENSOR ELEMENT AND METHOD OF PRODUCING THE SAME

BACKGROUND OF THE INVENTION AND RELATED ART STATEMENT

The present invention relates to a semiconductor optical sensor element and a method of producing the semiconductor optical sensor element. More specifically, the present invention relates to a semiconductor optical sensor element capable of being produced on a wafer level.

A semiconductor optical sensor element has been widely used for outputting a linear output according to environmental luminescence. In general, the semiconductor optical sensor element has an angular dependence in a light reception property. Accordingly, a light scattering plate is disposed on a housing of a conventional semiconductor optical sensor element, so that external light is irradiated on an optical-electric conversion element through the light scattering plate, thereby improving the light reception property (refer to Patent Reference 1).

In another conventional semiconductor optical sensor element, a luminescence sensor chip is disposed on one of a first electrode and a second electrode disposed on an insulation substrate. The luminescence sensor chip is connected to the one of the first electrode and the second electrode through a wiring portion. A sealing resin package is provided for sealing an entire portion of the conventional semiconductor optical sensor element, so that parts of the first electrode and the second electrode are exposed (refer to Patent Reference 2).

Patent Reference 1: Japanese Patent Publication No. 2006-287404

Patent Reference 2: Japanese Patent Publication No. 2002-176192

In the conventional semiconductor optical sensor element with the sealing resin package, after the luminescence sensor chip is attached to the insulation substrate, it is necessary to perform several steps for extending the wiring portion from the first electrode or the second electrode. Afterward, the sealing resin package is formed to obtain the conventional semiconductor optical sensor element. Accordingly, a manufacturing process becomes complicated, and it is difficult to reduce a size of the conventional semiconductor optical sensor element.

Further, as a mobile communication device has been miniaturized lately, it is necessary to produce a semiconductor optical sensor element using a W-CSP (Wafer Level Chip-size Package), thereby reducing a size and cost thereof.

In view of the problems described above, an object of the present invention is to provide a semiconductor optical sensor element and a method of producing the semiconductor optical sensor element capable of solving the problems of the conventional semiconductor optical sensor elements. In the invention, it is possible to minimize the number of manufacturing steps and improve yield.

Further objects and advantages of the invention will be apparent from the following description of the invention.

SUMMARY OF THE INVENTION

In order to attain the objects described above, according to a first aspect of the present invention, a method of producing a semiconductor optical sensor element includes the steps of: bonding a semiconductor wafer to a transparent optical wafer through an adhesive portion to form a bonded member; and cutting the bonded member at the adhesive portion to form the semiconductor optical sensor element formed of a sensor chip and a light scattering chip. The semiconductor wafer is provided with a sensor portion including a light reception portion of an optical-electric conversion element on a surface thereof. The transparent optical wafer includes a light scattering portion on a surface thereof.

According to a second aspect of the present invention, in the method of producing the semiconductor optical sensor element, a groove is formed in a dicing region, and a light blocking resin is disposed in the groove, thereby reducing cost.

According to a third aspect of the present invention, in the method of producing the semiconductor optical sensor element, a groove is formed in a dicing region, and a resin layer is disposed over an entire portion of the semiconductor chip. Then, a post forming step is performed for extending an electrode through the resin layer, thereby reducing the number of manufacturing steps.

According to a fourth aspect of the present invention, in the method of producing the semiconductor optical sensor element, a groove is formed such that the groove crosses the adhesive portion, and a light blocking resin layer is formed in the groove such that an outer side surface of the light blocking resin layer extends in parallel to a side surface of the light scattering chip and a side surface of the semiconductor chip. As a result, the light blocking resin layer is attached only to the side surface of the light scattering chip and the adhesive portion between the transparent optical wafer and the semiconductor wafer. Accordingly, it is possible to improve reliability of the semiconductor optical sensor element against moisture and reducing a size of the light blocking resin layer.

According to a fifth aspect of the present invention, the method of producing the semiconductor optical sensor element may include the step of grinding the semiconductor wafer of the bonded member after the bonded member is formed for adjusting a thickness of the semiconductor wafer. Accordingly, the transparent optical wafer supports the semiconductor to maintain strength thereof, thereby preventing the semiconductor wafer from being damaged during a bonded member processing step or transportation.

According to a sixth aspect of the present invention, a semiconductor optical sensor element includes a sensor chip including a sensor portion including a light reception portion of an optical-electric conversion element on a surface thereof; a light scattering chip bonded to the semiconductor chip with a specific distance therebetween and including a light scattering portion on a surface thereof; and an adhesive portion disposed between the semiconductor chip and the light scattering chip.

According to a seventh aspect of the present invention, in the semiconductor optical sensor element, the light scattering chip may be formed of a cover glass with transparency relative to light having a specific wavelength. The light scattering portion is formed on an outer surface of the light scattering chip through a sand blast process. The light scattering portion has roughness adjusted for scattering light having a specific wavelength.

In the semiconductor optical sensor element, when light is incident on the light reception portion of the optical-electric conversion element by a large angle relative to a direction perpendicular to the light reception portion, the light scattering portion scatters light to increase an amount of light received on the light reception portion, thereby expanding an incident range of the light reception portion.

When the light scattering chip formed of the cover glass scatters light, it is possible to provide the semiconductor optical sensor element with oblique incident light property having a substantially ideal cosign curve, thereby reducing manufacturing cost.

When a material or a roughness of the cover glass is optimized, the semiconductor optical sensor element is applicable to an ultraviolet light sensor or an infrared light sensor for detecting ultraviolet light or infrared light, in addition to visible light.

DETAILED DESCRIPTION OF PREFERRED EMBODIMENTS

Figure 1:
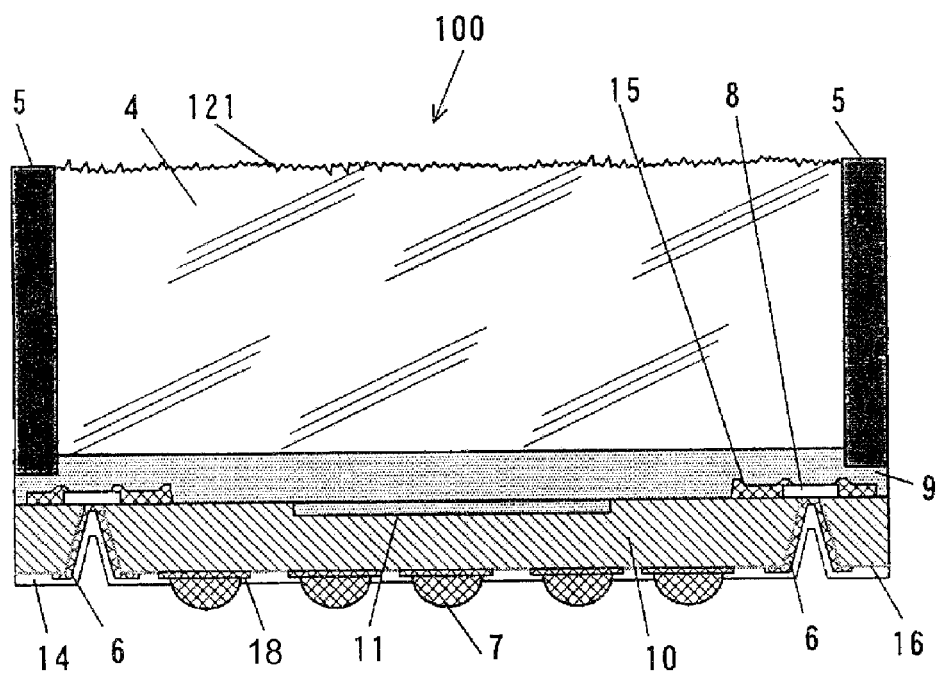
FIG. 1 is a schematic sectional view showing a semiconductor optical sensor element according to a first embodiment of the present invention.

Hereunder, embodiments of the present invention will be explained with reference to the accompanying drawings. In the following description, similar components are designated with the same reference numerals, and redundant explanations thereof are omitted. The embodiments simply represent examples, and do not limit the scope of the present invention.

First Embodiment

A first embodiment of the present invention will be explained. FIG. 1 is a schematic sectional view showing a semiconductor optical sensor element 100 according to the first embodiment of the present invention. The semiconductor optical sensor element 100 is formed of a sensor chip or a semiconductor chip 10 and a light scattering chip 40 bonded to the sensor chip 10 through an adhesive portion 9.

As shown in FIG. 1, the semiconductor optical sensor element 100 includes the light scattering chip 40 and the sensor chip 10 bonded to the light scattering chip 40 through the adhesive portion 9. The light scattering chip 40 is provided for scattering light. The sensor chip 10 is formed of a silicon (Si) substrate, and includes a sensor portion including a light reception portion 11 of an optical-electric conversion element, and through electrodes 6.

In the embodiment, the light scattering chip 40 includes a glass flat plate or a glass wafer 4 and a light scattering portion 121 formed on an outer main surface thereof. The light scattering chip 40 is individually cut from a transparent glass wafer (refer to as the glass wafer 4) together with the sensor chip 10. More specifically, the light scattering chip 40 includes the light scattering portion 121 on a backside surface (an outer surface) thereof, and a front side surface (an inner surface) of the glass wafer 4 is flat.

In the embodiment, the adhesive portion 9 is disposed on the inner surface of the glass wafer 4, and is formed of an adhesive material of an ultraviolet setting type, a thermal setting type, and the like. Further, the adhesive portion 9 is formed of a spacer (not shown) and adhesive layers (not shown) on both sides of the spacer.

In the embodiment, the adhesive portion 9 is attached to a first main surface of the sensor chip 10. The light reception portion 11 is formed on the first main surface of the sensor chip 10, and includes a light reception element (an optical-electric conversion element) such as a photo diode. The light reception portion 11 is connected to inner wiring portions 15 and metal pads 8 collectively formed as a sensor portion on the first main surface around the light reception portion 11.

In the embodiment, the sensor chip 10 also has a second main surface (a backside surface) opposite to the first main surface. Outer wiring portions 18 and outer terminals 7 are formed in the second main surface at specific positions. An insulation film 14 covers the second main surface except the outer terminals 7. Note that the sensor chip 10 has side surfaces. The side surfaces constitute edge portions of the sensor chip 10 crossing the first main surface and the second main surface. As shown FIG. 1, the side surfaces are exposed, and may be coated with insulation paint if necessary.

In the sensor chip 10, a through electrode 6 is formed below the metal pad 8 arranged near an outer circumference of the first main surface for connecting the inner wiring portion 15 and the outer wiring portion 18. The through electrode 6 penetrates through the sensor chip 10 from the first main surface to the second main surface. Accordingly, it is possible to electrically connect to the light reception portion 11 through the outer wiring portion 18 without providing a wiring portion through the side surface of the sensor chip 10. An insulation film 16 is disposed on an entire portion of the second main surface of the sensor chip 10 and an inner surface of the through electrode 6, so that the through electrode 6 is electrically isolated.

In the embodiment, the light scattering chip 40 may be attached to the first main surface of the sensor chip 10 through the adhesive portion 9 at a surrounding area of the light reception portion 11, so that a space is created between the light scattering chip 40 and the light reception portion 11. Further, a transparent adhesive material may be filled in the space between the light scattering chip 40 and the light reception portion 11. It is suffice that the light scattering chip 40 is attached to the first main surface of the sensor chip 10 through the adhesive portion 9 at least at the surrounding area of the light reception portion 11.

In the embodiment, light blocking resin layers 5 are disposed on the adhesive portion 9 and on side surfaces of the light scattering chip 40. When the semiconductor optical sensor element 100 is individually cut with dicing, the sensor chip 10 and the adhesive portion 9 have commonly flat side surfaces. Further, the light blocking resin layers 5 are attached to the adhesive portion 9 and the side surfaces of the light scattering chip 40, and have outer side surfaces flush with those of the sensor chip 10. Accordingly, in a plan view of the semiconductor optical sensor element 100, the light scattering chip 40 has an area smaller than that of the sensor chip 10.

When light is incident on the semiconductor optical sensor element 100, light passes through the light scattering portion 121 of the light scattering chip 40 and reaches the first main surface of the sensor chip 10, so that the light reception portion 11 converts light to an electrical signal. When light is incident on the side surfaces of the light scattering chip 40, the light blocking resin layers 5 block light. More specifically, the light blocking resin layers 5 are arranged on the side surfaces of the light scattering chip 40, so that it is possible to block light from entering through side surfaces of the semiconductor optical sensor element 100.

As described above, the light blocking resin layers 5 are arranged on the side surfaces of the light scattering chip 40, it is possible to reduce a size of the light scattering chip 40 and block light from entering through side surfaces of the semiconductor optical sensor element 100. Further, with the light blocking resin layers 5, it is possible to prevent the light scattering chip 40 from partially cracking during a manufacturing process.

Figure 2:
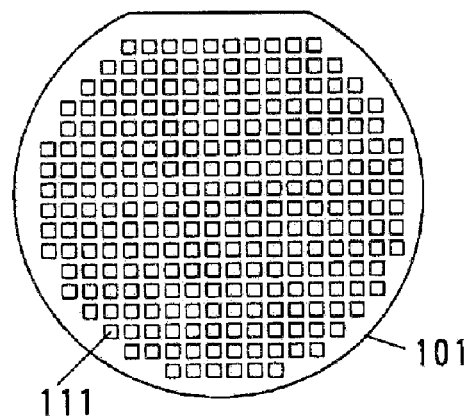
FIG. 2 is a schematic plane view showing a semiconductor wafer according to the first embodiment of the present invention.

A method of producing the semiconductor optical sensor element 100 will be explained. FIG. 2 is a schematic plane view showing a semiconductor wafer 101 according to the first embodiment of the present invention.

As shown in FIG. 2, a plurality of or an array of sensor portions 111 are formed on the first main surface of the semiconductor wafer 101 in a matrix pattern through a semiconductor manufacturing process. The semiconductor wafer 101 typically has a diameter of six or eight inches. In FIG. 2, the sensor portions 111 are schematically represented as a rectangle element, and a shape and the number thereof are not limited.

Figure 3:
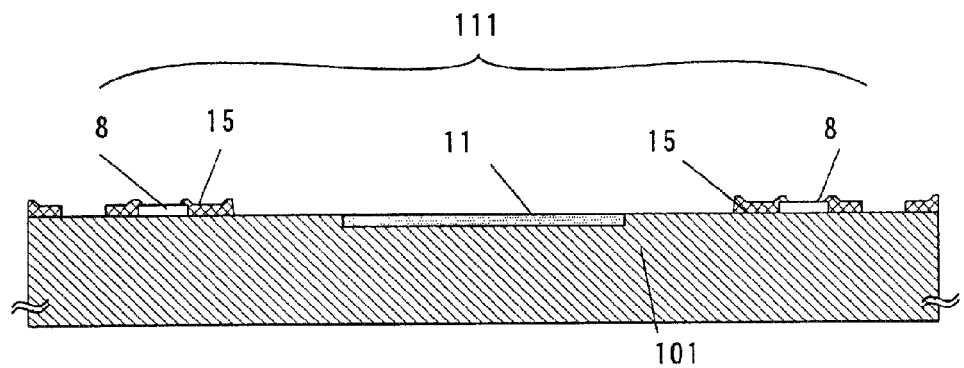
FIG. 3 is a schematic enlarged sectional view showing the semiconductor wafer according to the first embodiment of the present invention.

FIG. 3 is a schematic enlarged sectional view showing the semiconductor wafer 101 according to the first embodiment of the present invention.

As shown in FIG. 3, the light reception portion 11 including the optical-electric conversion element and the metal pads 8 arranged around the light reception portion 11 are formed on the first main surface of the semiconductor wafer 101 in each of the sensor portions 111 through the semiconductor manufacturing process. In this step, an amplifier (not shown) formed of several CMOS (Complementary Metal-Oxide Semiconductor) transistors may be disposed per the photo diode embedded in the light reception portion 11. The metal pads 8 may be formed of a metal with good conductivity such as aluminum (Al).

In the next step, the inner wiring portions 15 are formed, so that the light reception portion 11 is connected to the metal pads 8 arranged around the light reception portion 11. Through the steps described above, a plurality of or an array of the sensor portions 111 are formed on the first main surface of the semiconductor wafer 101 in the matrix pattern with a space in between to be a dicing region in a later step.

In the next step, the glass wafer 4 is prepared. The glass wafer 4 has a diameter the same as that of the semiconductor wafer 101, i.e., six or eight inches, and a thickness of 300 to 2,000 µm. Further, the glass wafer 4 is formed of glass having a refractive index in a range of 1.45 to 2.00 according to a target wavelength. After the glass wafer 4 is prepared, a sand blast surface roughening process is performed as a physical etching process. More specifically, grinding particles with a specific index are blown against one of main surfaces of the glass wafer 4 with compressed air, so that an undulation surface is formed.

Figure 4:
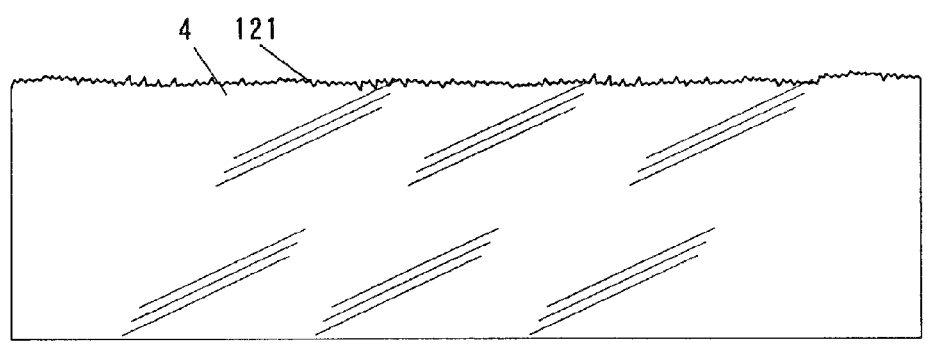
FIG. 4 is a schematic enlarged sectional view showing a glass wafer according to the first embodiment of the present invention.

FIG. 4 is a schematic enlarged sectional view showing the glass wafer 4 of the semiconductor optical sensor element 100 processed with the sand blast surface roughening process according to the first embodiment of the present invention.

As shown in FIG. 4, with the sand blast surface roughening process, the light scattering portion 121 with a roughness of 0.1 to 100 µm is formed on the entire surface of the glass wafer 4. When the light scattering portion 121 has the roughness in the range of 0.1 to 100 µm, it is possible to scatter external light (oblique incident light property or cosine property).

In the embodiment, other than the physical etching process such as the sand blast surface roughening process, a chemical etching process may be adopted. In the chemical etching process, the surface of the glass wafer 4 contacts with a hydrogen fluoride solution to be dissolved, so that an undulation surface is formed. Further, after the sand blast surface roughening process, the chemical etching process may be performed.

Figure 5:
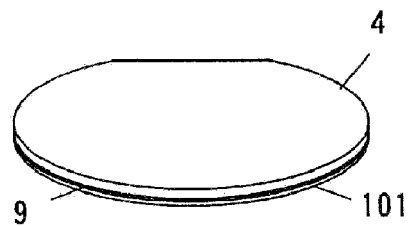
FIG. 5 is a schematic perspective view showing a bonded member formed of the semiconductor wafer and the glass wafer according to the first embodiment of the present invention.

In the next step, the semiconductor wafer 101 having the sensor portions 111 is attached to the glass wafer 4 with the adhesive portion 9 as shown in FIG. 5. FIG. 5 is a schematic perspective view showing a bonded member formed of the semiconductor wafer 101 and the glass wafer 4 according to the first embodiment of the present invention.

As shown in FIG. 5, the semiconductor wafer 101 is attached and fixed to the glass wafer 4 such that the light scattering portion 121 of the glass wafer 4 faces outside and the sensor portions 111 of the semiconductor wafer 101 face inside. The adhesive portion 9 is formed of a photosensitive polymer with high temperature resistance such as benzocyclobutene (BCB), a polyimide, and the like as the adhesive material. The adhesive material is an ultraviolet setting type or a thermal setting type. When the adhesive material is formed of a photosensitive polymer, light is irradiated from a side of the glass wafer 4, so that the adhesive portion 9 is hardened through light irradiation. The adhesive portion 9 is provided for maintaining the specific distance between the semiconductor wafer 101 and the glass wafer 4, and for sealing the sensor portions 111 during a grinding process, a through electrode forming process, a dicing process, and the like to be performed later.

Figure 6:
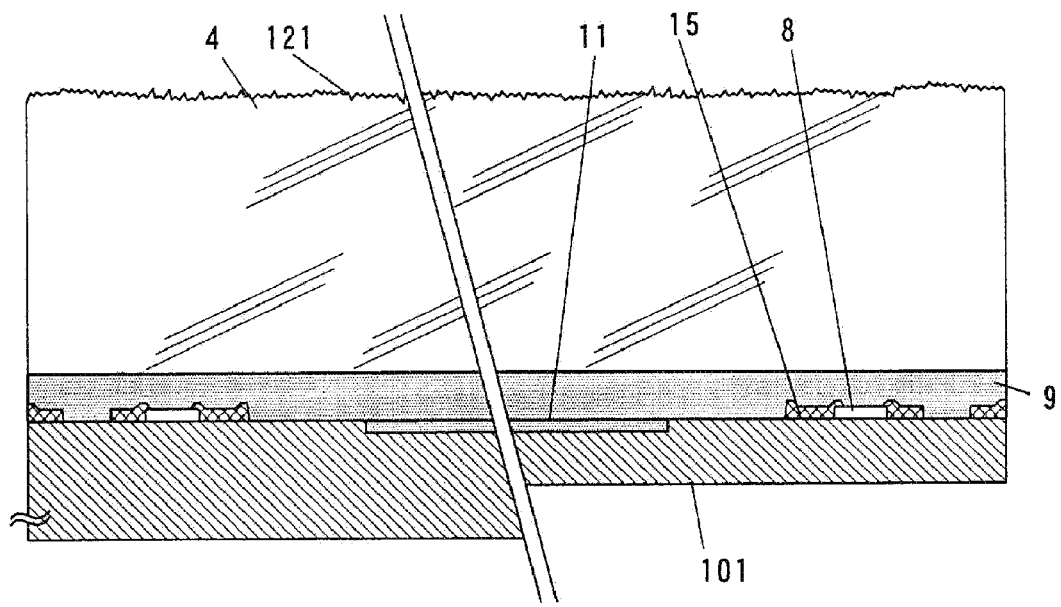
FIG. 6 is a schematic sectional view No. 1 showing the bonded member formed of the semiconductor wafer and the glass wafer in a manufacturing process of the semiconductor optical sensor element according to the first embodiment of the present invention.

In the next step, the backside surface (the exposed surface) of the semiconductor wafer 101 integrated with the glass wafer 4 is ground. FIG. 6 is a schematic sectional view No. 1 showing the bonded member formed of the semiconductor wafer 101 and the glass wafer 4 in a manufacturing process of the semiconductor optical sensor element 100 according to the first embodiment of the present invention.

As shown in FIG. 6, after a protective sheet for the backside surface grinding is attached to the light scattering portion 121 of the glass wafer 4, the semiconductor wafer 101 is ground from an original thickness of 600 to 700 μm to a specific thickness of 50 to 100 μm. After the backside surface grinding, the protective sheet is removed, and may remain for protecting the light scattering portion 121 during the later steps.

In the next step, the through electrodes 6, the outer wiring portions 18, and the outer terminals 7 are formed in the second main surface of the semiconductor wafer 101 integrated with the glass wafer 4. More specifically, through holes 61 are formed in the semiconductor wafer 101 with deep digging etching, and wiring portions are formed through copper plating and the like to form electrode pads.

Figure 7:
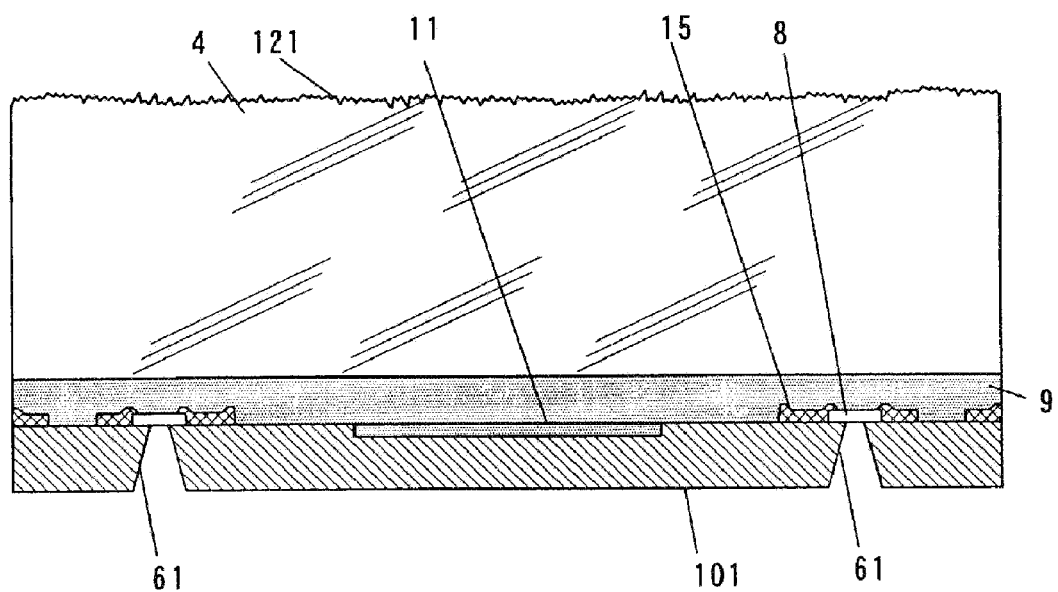
FIG. 7 is a schematic sectional view No. 2 showing the bonded member formed of the semiconductor wafer and the glass wafer in the manufacturing process of the semiconductor optical sensor element according to the first embodiment of the present invention.

FIG. 7 is a schematic sectional view No. 2 showing the bonded member formed of the semiconductor wafer 101 and the glass wafer 4 in the manufacturing process of the semiconductor optical sensor element 100 according to the first embodiment of the present invention.

As shown in FIG. 7, first, the through holes 61 with a diameter of 100 to 200 m are formed in the semiconductor wafer 101 from the second main surface (the backside surface) to reach the metal pads 8. More specifically, the through holes 61 are formed with a reactive ion etching method in the semiconductor wafer 101 from the second main surface at positions of the metal pads 8 of the semiconductor wafer 101, so that the through holes 61 have a size slightly smaller than that of the metal pads 8.

In the reactive ion etching method, first, a mask (not shown) formed of a metal or a resist having openings corresponding to the through holes 61 is disposed on the second main surface of the semiconductor wafer 101. Then, the semiconductor wafer 101 is etched through the openings through an $SiF_4$ generation reaction under an environment of a mix gas containing $CF_4$, thereby forming the through holes 6.

Figure 8:
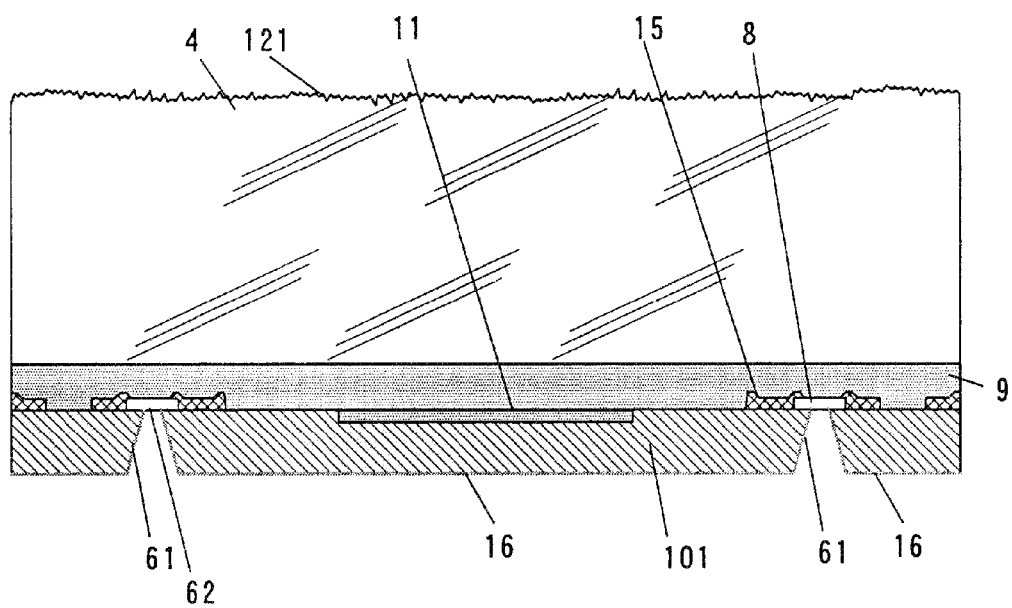
FIG. 8 is a schematic sectional view No. 3 showing the bonded member formed of the semiconductor wafer and the glass wafer in the manufacturing process of the semiconductor optical sensor element according to the first embodiment of the present invention.

FIG. 8 is a schematic sectional view No. 3 showing the bonded member formed of the semiconductor wafer 101 and the glass wafer 4 in the manufacturing process of the semiconductor optical sensor element 100 according to the first embodiment of the present invention.

As shown in FIG. 8, the insulation film 16 formed of $SiO_2$ is formed on inner surfaces and bottom surfaces (for exposing the metal pad 8) of the through holes 61 and the second main surface of the semiconductor wafer 101 with a CVD (Chemical Vapor Deposition) method. More specifically, the insulation film 16 is formed such that a film thickness thereof on the bottom surfaces (for exposing the metal pad 8) thereof is smaller than that on the second main surface of the semiconductor wafer 101. Accordingly, with subsequent reactive ion etching, opening portions 62 of the insulation film 16 are formed at the bottom surfaces of the through holes 61 to expose the metal pad 8, and the insulation film 16 remains on the inner surfaces of the through holes 61 and the second main surface of the semiconductor wafer 101.

Figure 9:
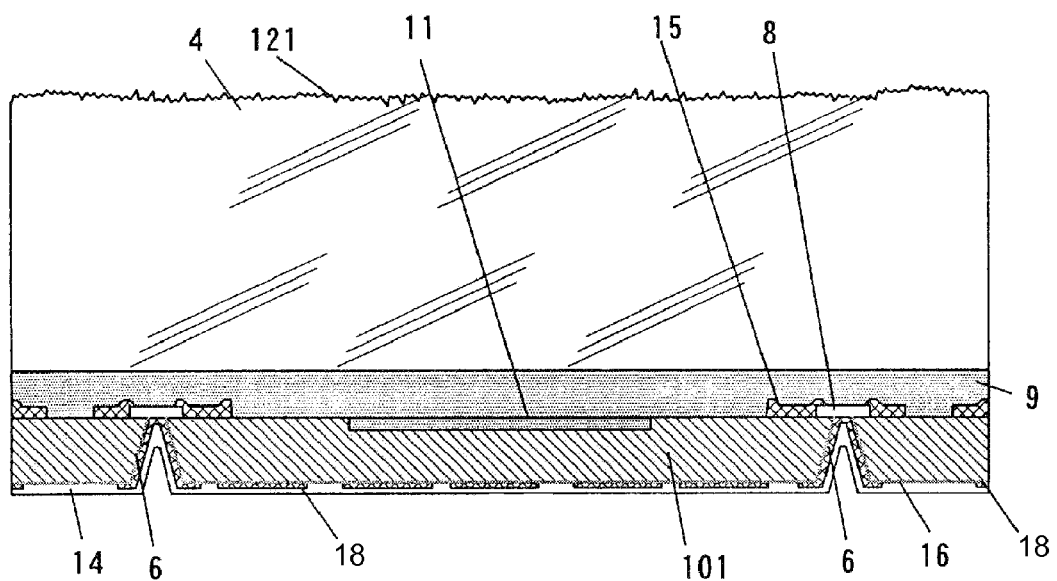
FIG. 9 is a schematic sectional view No. 4 showing the bonded member formed of the semiconductor wafer and the glass wafer in the manufacturing process of the semiconductor optical sensor element according to the first embodiment of the present invention.

FIG. 9 is a schematic sectional view No. 4 showing the bonded member formed of the semiconductor wafer 101 and the glass wafer 4 in the manufacturing process of the semiconductor optical sensor element 100 according to the first embodiment of the present invention.

In the next step, a mask (not shown) having a specific pattern is formed on the insulation film 16 on the second main surface of the semiconductor wafer 101. The mask has openings corresponding to the through holes 61 (in which the metal pads 8 are exposed), the through electrodes 6 around the through holes 61, and the outer wiring portions 18 to be connected to the through electrodes 6. Then, as shown in FIG. 9, the outer wiring portions 18 and the through electrode 6 are formed.

Figure 10:
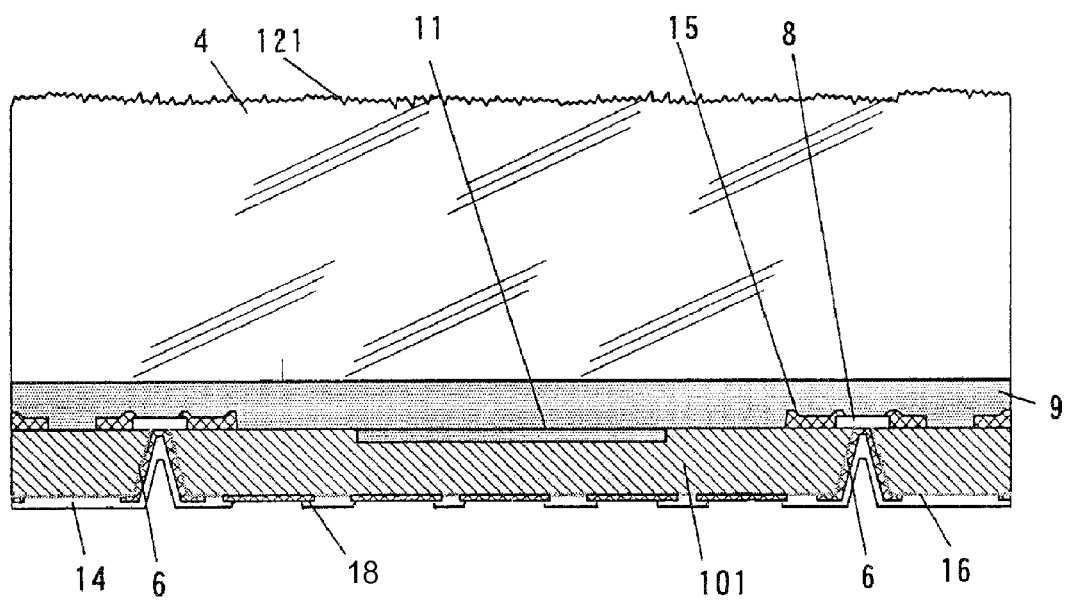
FIG. 10 is a schematic sectional view No. 5 showing the bonded member formed of the semiconductor wafer and the glass wafer in the manufacturing process of the semiconductor optical sensor element according to the first embodiment of the present invention.

FIG. 10 is a schematic sectional view No. 5 showing the bonded member formed of the semiconductor wafer 101 and the glass wafer 4 in the manufacturing process of the semiconductor optical sensor element 100 according to the first embodiment of the present invention.

In the next step, as shown in FIG. 10, an insulation film 14 is formed on an entire backside surface of the semiconductor wafer 101. Then, the insulation film 14 is patterned through lithography, so that portions of the outer wiring portions 18, where the outer terminals 7 for connecting to an external circuit are formed, are exposed.

Figure 11:
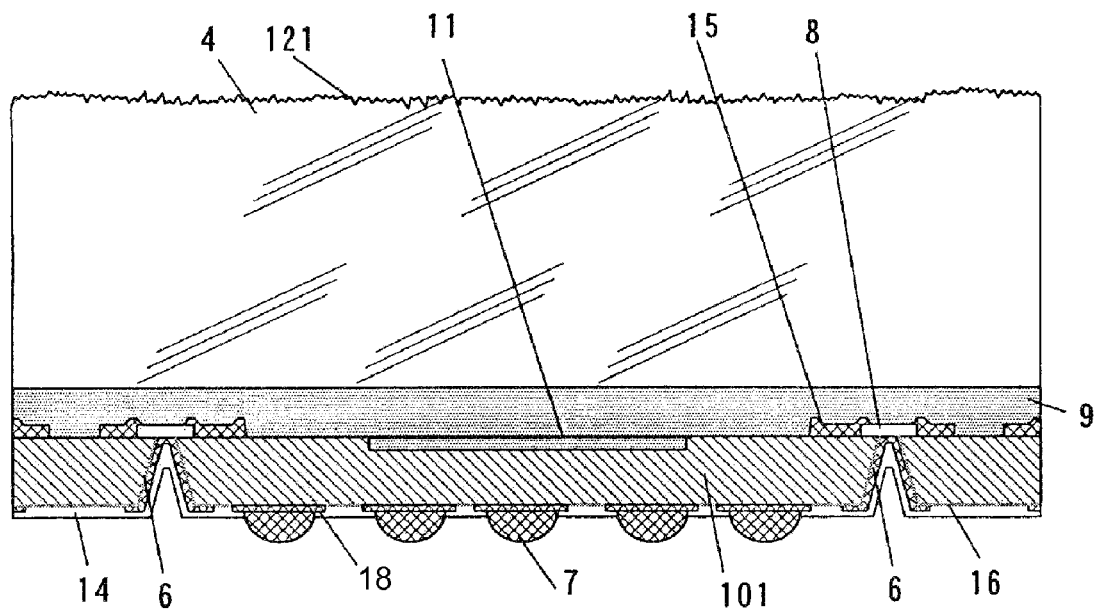
FIG. 11 is a schematic sectional view No. 6 showing the bonded member formed of the semiconductor wafer and the glass wafer in the manufacturing process of the semiconductor optical sensor element according to the first embodiment of the present invention.

FIG. 11 is a schematic sectional view No. 6 showing the bonded member formed of the semiconductor wafer 101 and the glass wafer 4 in the manufacturing process of the semiconductor optical sensor element 100 according to the first embodiment of the present invention.

In the next step, a solder waste is coated and reflows on the portions of the outer wiring portions 18 thus exposed on the backside surface of the semiconductor wafer 101. Then, remaining flux is removed, thereby forming the outer terminals 7 as shown in FIG. 11. Before the outer terminals 7 are formed, a base metal film (not shown) may be formed.

In the embodiment, the insulation film 14 is formed of a material such as $SiO_2$, SiN, and polyimide (PI). The outer wiring portions 18 are formed of a conductive material such as Cu, Al, Ag, Ni, Au, and the like. Further, the outer terminals 7 are formed of a material such as SnAg and NiAu.

Figure 12:
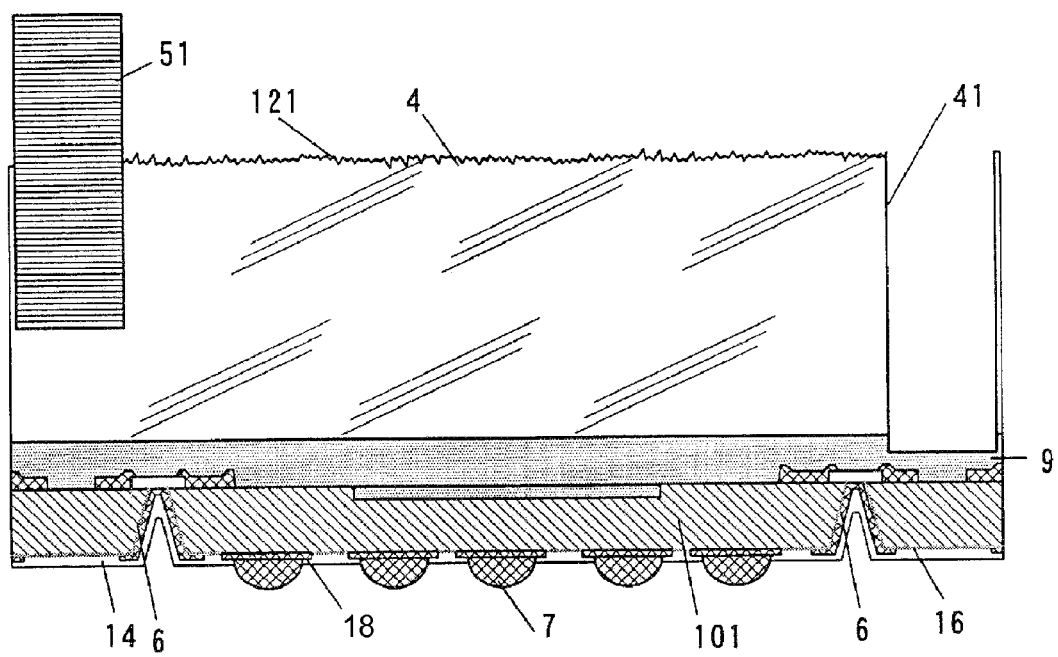
FIG. 12 is a schematic sectional view No. 7 showing the bonded member formed of the semiconductor wafer and the glass wafer in the manufacturing process of the semiconductor optical sensor element according to the first embodiment of the present invention.

FIG. 12 is a schematic sectional view No. 7 showing the bonded member formed of the semiconductor wafer 101 and the glass wafer 4 in the manufacturing process of the semiconductor optical sensor element 100 according to the first embodiment of the present invention.

In the next step, as shown in FIG. 12, the glass wafer 4 is cut until the adhesive portion 9 is exposed using a first dicing blade 51 with a blade dicing method, so that grooves 41 are formed in a dicing region. More specifically, the bonded member formed of the semiconductor wafer 101 and the glass wafer 4 is placed on a supporting table of a dicing device (not shown), so that the first dicing blade 51 cuts the glass wafer 4.

It is preferred that the first dicing blade 51 cuts the glass wafer 4 in a cut width (a blade thickness) of 60 to 100 m, so that the same portion can be cut in a subsequent step.

As shown in FIG. 12, the first dicing blade 51 cuts the bonded member from the side of the glass wafer 4 toward the semiconductor wafer 101. Note that the grooves 41 may be formed with a laser method without using the first dicing blade 51.

Figure 13:
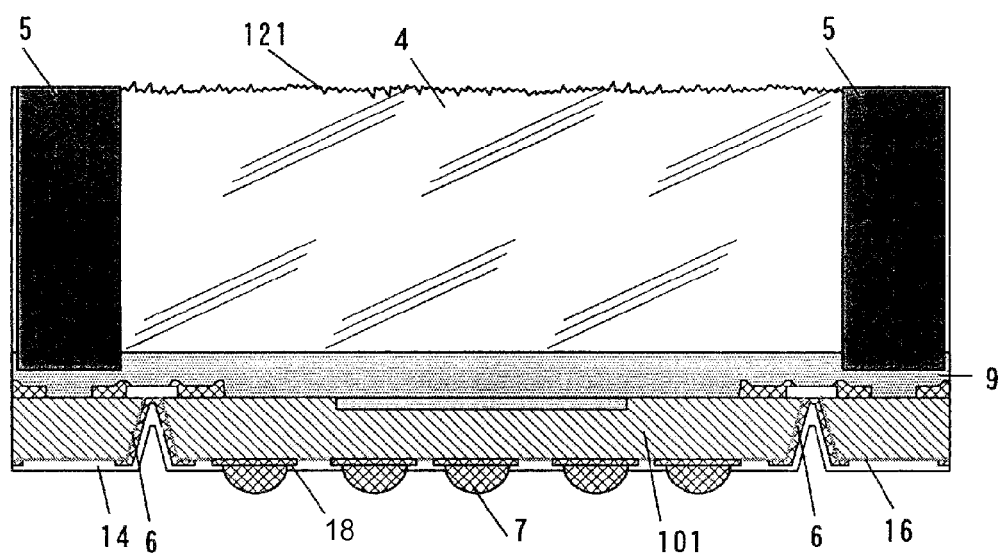
FIG. 13 is a schematic sectional view No. 8 showing the bonded member formed of the semiconductor wafer and the glass wafer in the manufacturing process of the semiconductor optical sensor element according to the first embodiment of the present invention.

FIG. 13 is a schematic sectional view No. 8 showing the bonded member formed of the semiconductor wafer 101 and the glass wafer 4 in the manufacturing process of the semiconductor optical sensor element 100 according to the first embodiment of the present invention.

In the next step, as shown in FIG. 13, a light blocking resin is poured into the grooves 41 with a printing method or a dispensing method to form light blocking resin layers 5. The light blocking resin layers 5 are formed of a polymer resin such as an epoxy resin containing a black colorant such as carbon black and iron(III) tetraoxide. Other than the black colorant, a dark color colorant with light blocking capability may be used.

Figure 14:
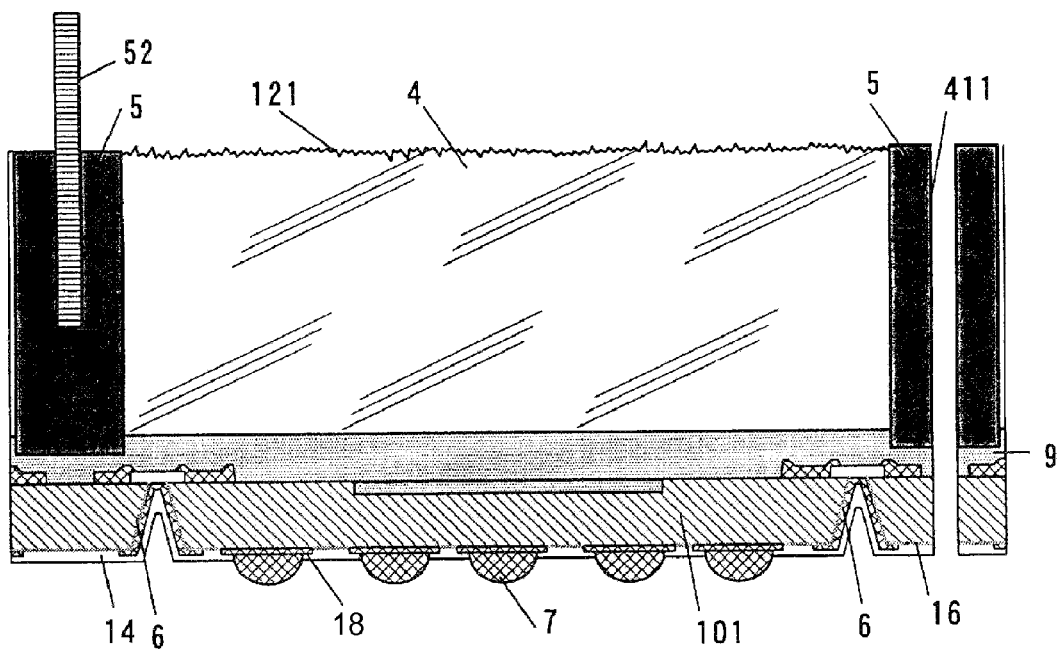
FIG. 14 is a schematic sectional view No. 9 showing the bonded member formed of the semiconductor wafer and the glass wafer in the manufacturing process of the semiconductor optical sensor element according to the first embodiment of the present invention.

FIG. 14 is a schematic sectional view No. 9 showing the bonded member formed of the semiconductor wafer 101 and the glass wafer 4 in the manufacturing process of the semiconductor optical sensor element 100 according to the first embodiment of the present invention.

In the next step, as shown in FIG. 14, the bonded member formed of the semiconductor wafer 101 and the glass wafer 4 is cut using a second dicing blade 52 having a blade thickness smaller than that of the first dicing blade 51. More specifically, the second dicing blade 52 cuts the bonded member from the side of the glass wafer 4 in a thickness direction thereof along a center of the dicing region of the light blocking rein layers 5, so that a cut surface 411 is formed in the dicing region, thereby obtaining the semiconductor optical sensor element 100 individually.

In this step, the second dicing blade 52 has the blade thickness smaller than that of the first dicing blade 51 and cuts the bonded member at a specific position, so that it is possible to completely cut through the light blocking rein layers 5, while the light blocking rein layers 5 remain on the side surfaces of the glass wafer 4.

Before the bonded member is cut in the dicing device, a dicing tape (not shown) is attached to the semiconductor wafer 101. Alternatively, the dicing tape (not shown) may be attached to the glass wafer 4 before the bonded member is placed in the dicing device, so that the second dicing blade 52 cuts the bonded member from the side of the semiconductor wafer 101.

Through the steps described above, the bonded member formed of the semiconductor wafer 101 and the glass wafer 4 is fully cut in a specific size, thereby obtaining the semiconductor optical sensor element 100 formed of the light scattering chip 40, the adhesive portion 9, and the sensor chip 10 shown in FIG. 1 individually.

As described above, the bonded member formed of the semiconductor wafer 101 and the glass wafer 4 is fully cut in a specific size. Accordingly, it is possible to obtain the semiconductor optical sensor element 100 formed of the light scattering chip 40, the adhesive portion 9, and the sensor chip 10 shown in FIG. 1 capable of preventing light from entering from the side surfaces of the light scattering chip 40 with the light blocking resin layers 5. In the embodiment, the light scattering chip 40 has at least two sides shorter than those of the sensor chip 10, and the light blocking resin layers 5 cover all side surfaces of the light scattering chip 40, and the configuration is not limited thereto. Further, the bonded member may be fully cut with a laser method, other than the blade dicing method, as far as the light blocking resin layers 5 remain on the side surfaces of the light scattering chip 40 after the cut.

In the embodiment, the light blocking resin layers 5 blocks light entering from the side surfaces of the light scattering chip 40, thereby improving performance of the semiconductor optical sensor element 100. Further, it is possible to reduce a scrub line width of the sensor chip 10, even when the light blocking resin layers 5 have a large width. Accordingly, it is possible to form a large number of chips on one single wafer, thereby improving yield and reducing cost.

In the embodiment, the light blocking resin layers 5 with a large width are cut according to the scrub line width of the sensor chip 10, and the light blocking resin layers 5 are simultaneously formed per the semiconductor optical sensor element 100, thereby reducing the number of steps. Further, the light blocking resin layers 5 are formed on the side surfaces of the light scattering chip 40 having brittle nature, thereby making it possible to prevent the light scattering chip 40 from cracking or being damaged, and to easily handle the semiconductor optical sensor element 100. Further, the light blocking resin layers 5 are formed on the side surfaces of the light scattering chip 40, thereby eliminating a separate guide cover for blocking light and reducing cost. Accordingly, it is not necessary to attach a light blocking cover one by one in a conventional method, and it is possible to produce the semiconductor optical sensor element 100 including the light blocking film from the wafers.

Second Embodiment

Figure 15:
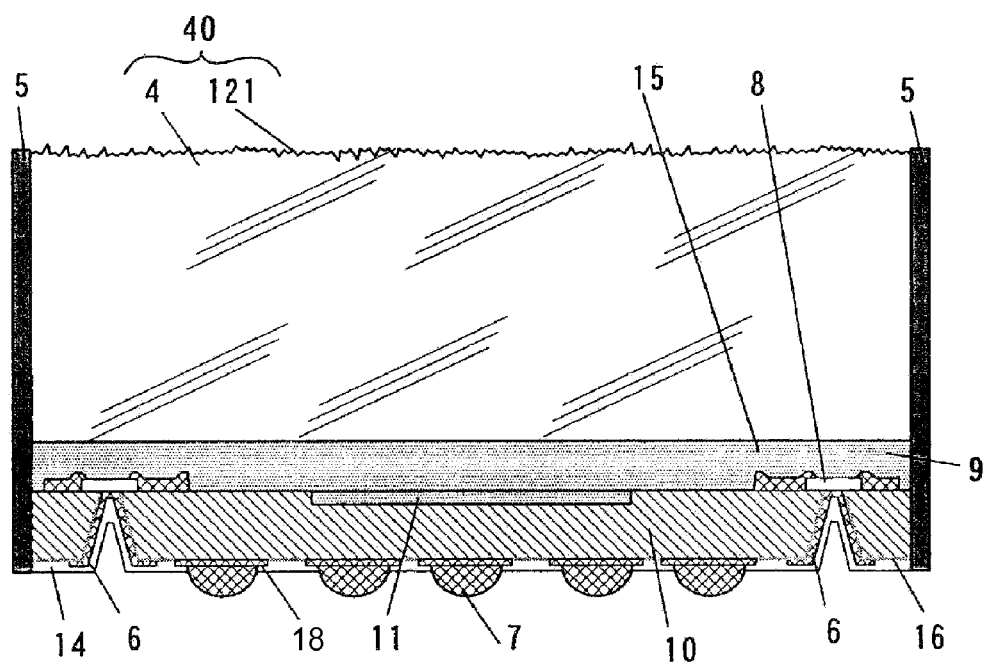
FIG. 15 is a schematic sectional view showing a semiconductor optical sensor element according to a second embodiment of the present invention.

A second embodiment of the present invention will be explained next. FIG. 15 is a schematic sectional view showing a semiconductor optical sensor element according to the second embodiment of the present invention.

As shown in FIG. 15, the semiconductor optical sensor element includes the light scattering chip 40 as the transparent chip and the sensor chip 10 bonded to the light scattering chip 40 with the adhesive portion 9. Further, the light blocking resin layers 5 are disposed on entire side surfaces of the light scattering chip 40 and entire side surfaces of the sensor chip 10. Other configuration is similar to that of the semiconductor optical sensor element 100 in the first embodiment shown in FIG. 1.

A method of producing the semiconductor optical sensor element will be explained next. FIGS. 16(A) to 16(D) are schematic sectional views showing a bonded member formed of the semiconductor wafer 101 and the glass wafer 4 in a manufacturing process of the semiconductor optical sensor element according to the second embodiment of the present invention.

In the second embodiment, the semiconductor optical sensor element is produced with a method similar to that in the first embodiment from the step of forming the bonded member of the glass wafer 4 and the semiconductor wafer 101 shown in FIG. 2 to the step of forming the outer terminals 7 shown in FIG. 11.

Figure 16A:
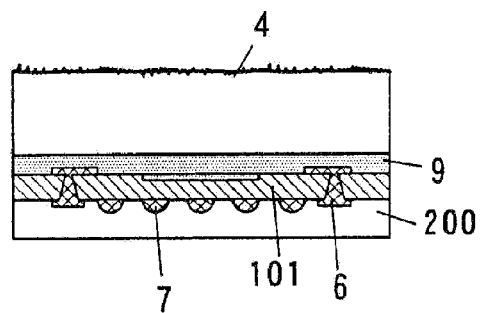
FIGS. 16(A) to 16(D) are schematic sectional views showing a bonded member formed of a semiconductor wafer and a glass wafer in a manufacturing process of the semiconductor optical sensor element according to the second embodiment of the present invention.

In the next step, as shown in FIG. 16(A), a dicing tape 200 is attached to an entire surface of the semiconductor wafer 101, and then the bonded member of the glass wafer 4 and the semiconductor wafer 101 is placed in the dicing device.

Figure 16B:
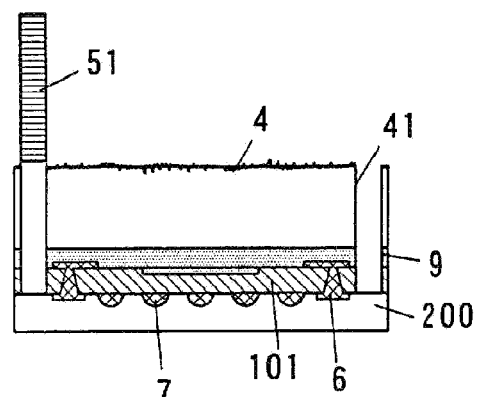

In the next step, as shown in FIG. 16(B), the glass wafer 4, the adhesive portion 9, and the semiconductor wafer 101 are fully cut up to an interface between the dicing tape 200 and the semiconductor wafer 101 from the side of the glass wafer 4 using the first dicing blade 51 with the blade dicing method (alternatively, the laser method), so that the grooves 41 are formed. It is preferred that the first dicing blade 51 cuts the glass wafer 4, the adhesive portion 9, and the semiconductor wafer 101 in the cut width (the blade thickness) of 60 to 100 m, so that the same portion can be cut in the subsequent step.

Figure 16C:
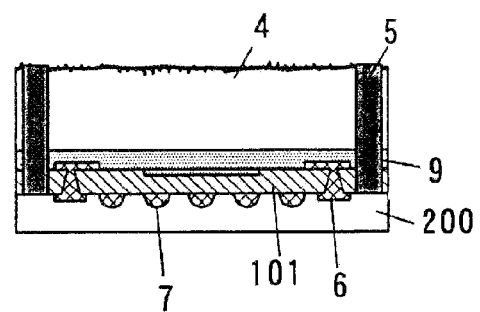

In the next step, as shown in FIG. 16(C), the light blocking resin is poured into the grooves 41 with the printing method or the dispensing method to form light blocking resin layers 5. Accordingly, the bonded member is integrated one more time without the grooves 41.

Figure 16D:
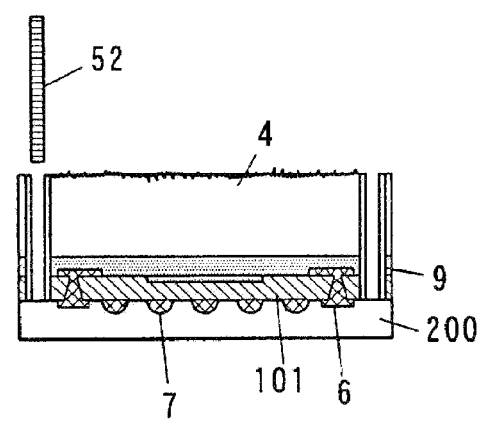

In the next step, as shown in FIG. 16(D), the bonded member formed of the semiconductor wafer 101 and the glass wafer 4 is cut using the second dicing blade 52 in the thickness direction thereof along the center of the light blocking rein layers 5, thereby obtaining the semiconductor optical sensor element individually.

In this step, the second dicing blade 52 has the blade thickness smaller than that of the first dicing blade 51 and cuts the bonded member at a specific position, so that it is possible to completely cut through the light blocking rein layers 5, while the light blocking rein layers 5 remain on the side surfaces of the glass wafer 4, the adhesive portion 9, and the semiconductor wafer 101.

Through the steps described above, the bonded member formed of the semiconductor wafer 101 and the glass wafer 4 is fully cut in a specific size. Accordingly, it is possible to obtain the semiconductor optical sensor element formed of the light scattering chip 40, the adhesive portion 9, and the sensor chip 10 shown in FIG. 15 capable of preventing light from entering from the side surfaces of the glass wafer 4 with the light blocking resin layers 5.

In the embodiment, the light blocking resin layers 5 are disposed on the entire side surfaces of the semiconductor optical sensor element (the light scattering chip 40, the adhesive portion 9, and the sensor chip 10). Accordingly, it is possible to block light more securely, and to improve moisture resistance and sir tightness of an interface.

Third Embodiment

Figure 17:
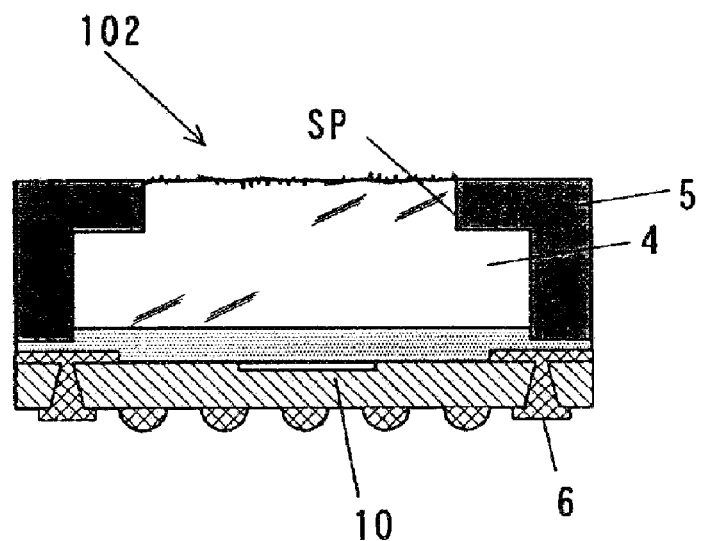
FIG. 17 is a schematic sectional view showing a semiconductor optical sensor element according to a third embodiment of the present invention.

A third embodiment of the present invention will be explained next. FIG. 17 is a schematic sectional view showing a semiconductor optical sensor element 102 according to the third embodiment of the present invention.

As shown in FIG. 17, the semiconductor optical sensor element 102 includes the light scattering chip 40 as the transparent chip and the sensor chip 10 bonded to the light scattering chip 40 with the adhesive portion 9. Further, the side surfaces of the glass wafer 4 are formed in a two-stage step shape SP, and the light blocking resin layers 5 are disposed on the side surfaces of the light scattering chip 40, so that the light blocking resin layers 5 protrude inside toward the light reception portion 11 to define an opening portion thereof. Other configuration is similar to that of the semiconductor optical sensor element 100 in the first embodiment shown in FIG. 1.

In the embodiment, in the dicing step, a plurality of dicing blade having different thicknesses is used to form the two-stage step shape SP of the side surfaces of the light scattering chip 40.

Fourth Embodiment

Figure 18:
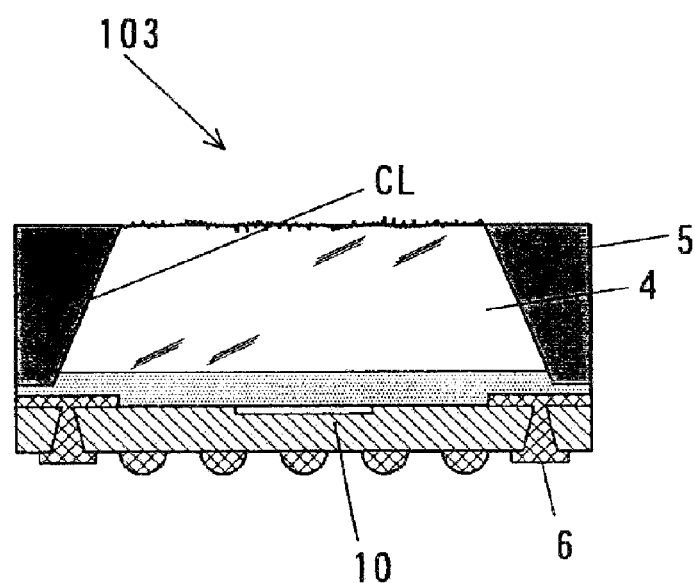
FIG. 18 is a schematic sectional view showing a semiconductor optical sensor element according to a fourth embodiment of the present invention.

A fourth embodiment of the present invention will be explained next. FIG. 18 is a schematic sectional view showing a semiconductor optical sensor element 103 according to the fourth embodiment of the present invention.

As shown in FIG. 18, the semiconductor optical sensor element 102 includes the light scattering chip 40 as the transparent chip and the sensor chip 10 bonded to the light scattering chip 40 with the adhesive portion 9. Further, the side surfaces of the glass wafer 4 are formed in an inclined shape CL not perpendicular but inclined relative to the main surface, and the light blocking resin layers 5 are disposed on the side surfaces of the light scattering chip 40, so that the light blocking resin layers 5 protrude inside toward the light reception portion 11 to define an opening portion thereof. Other configuration is similar to that of the semiconductor optical sensor element 100 in the first embodiment shown in FIG. 1.

In the embodiment, in the dicing step, a dicing blade having a thickness gradually decreasing toward an outer circumferential edge thereof in a radial direction thereof is used to form the inclined shape CL of the side surfaces of the light scattering chip 40.

When the side surfaces of the light scattering chip 40 are formed in the inclined shape CL, stray light tends to be reflected toward a circumference of the light reception portion 11, thereby reducing noise due to stray light.

In the embodiments described above, in the light scattering chip 40, the glass wafer 4 has one flat main surface (the inner surface) and the light scattering portion 121 formed on the backside surface (the outer surface). A second light scattering portion may be formed on the inner surface of the glass wafer 4, as far as the light scattering portion 121 is formed on the backside surface (the outer surface). Further, the light reception portion 11 of the sensor chip 10 is attached to the light scattering chip 40 through the adhesive portion 9. Alternatively, a space (a gap) may be provided above the light reception portion 11, so that the sensor chip 10 is attached to the light scattering chip 40 through the adhesive portion 9 around the light reception portion 11.

The disclosure of Japanese Patent Application No. 2008-333026, filed on Dec. 26, 2008, is incorporated in the application by reference.

While the invention has been explained with reference to the specific embodiments of the invention, the explanation is illustrative and the invention is limited only by the appended claims.

What is claimed is:

1. A method of producing a semiconductor optical sensor element, comprising the steps of:
   bonding a semiconductor wafer to a transparent optical wafer through an adhesive portion to form a bonded member, said semiconductor wafer including a sensor portion including a light reception portion of an optical-electric conversion element on a surface thereof, said transparent optical wafer including a light scattering portion on a surface thereof;
   cutting the bonded member at the adhesive portion to form the semiconductor optical sensor element formed of a sensor chip and a light scattering chip;
   forming a groove in the transparent optical wafer to expose the adhesive portion; and
   disposing a light blocking resin in the groove so that the light blocking resin remains on a side surface of the transparent optical wafer when the bonded member is cut with a dicing blade having a thickness smaller than a width of the groove.

2. The method of producing the semiconductor optical sensor element according to claim 1, further comprising the steps of forming a groove in the transparent optical wafer and the semiconductor wafer, and disposing a light blocking resin in the groove so that the light blocking resin remains on side surfaces of the transparent optical wafer and the semiconductor wafer when the bonded member is cut with a dicing blade having a thickness smaller than a width of the groove.

3. The method of producing the semiconductor optical sensor element according to claim 1, further comprising the step of grinding the semiconductor wafer to reduce a thickness thereof.

4. The method of producing the semiconductor optical sensor element according to claim 1, further comprising the step of processing a surface of a glass flat plate through chemical etching or physical etching to form the light scattering portion of the transparent optical wafer.

5. The method of producing the semiconductor optical sensor element according to claim 1, further comprising the step of blowing grinding particles against a surface of a glass flat plate with compressed air as physical etching to form an undulation surface as the light scattering portion of the transparent optical wafer.

6. The method of producing the semiconductor optical sensor element according to claim 1, further comprising the step of dissolving a surface of a glass flat plate with a hydrogen fluoride solution as chemical etching to form an undulation surface as the light scattering portion of the transparent optical wafer.

7. A method of producing a semiconductor optical sensor element, comprising the steps of
bonding a semiconductor wafer to a transparent optical wafer through an adhesive portion to form a bonded member, said semiconductor wafer including a sensor portion including a light reception portion of an optical-electric conversion element on a surface thereof, said transparent optical wafer including a light scattering portion on a surface thereof;
cutting the bonded member at the adhesive portion to form the semiconductor optical sensor element formed of a sensor chip and a light scattering chip;
forming a groove in the transparent optical wafer and the semiconductor wafer; and
disposing a light blocking resin in the groove so that the light blocking resin remains on side surfaces of the transparent optical wafer and the semiconductor wafer when the bonded member is cut with a dicing blade having a thickness smaller than a width of the groove.

8. The method of producing the semiconductor optical sensor element according to claim 7, further comprising the step of processing a surface of a glass flat plate through chemical etching or physical etching to form the light scattering portion of the transparent optical wafer.

9. The method of producing the semiconductor optical sensor element according to claim 7, further comprising the step of blowing grinding particles against a surface of a glass flat plate with compressed air as physical etching to form an undulation surface as the light scattering portion of the transparent optical wafer.

10. The method of producing the semiconductor optical sensor element according to claim 7, further comprising the step of dissolving a surface of a glass flat plate with a hydrogen fluoride solution as chemical etching to form an undulation surface as the light scattering portion of the transparent optical wafer.

11. A method of producing a semiconductor optical sensor element, comprising the steps of:
bonding a semiconductor wafer to a transparent optical wafer through an adhesive portion to form a bonded member, said semiconductor wafer including a sensor portion including a light reception portion of an optical-electric conversion element on a surface thereof, said transparent optical wafer including a light scattering portion on a surface thereof;
cutting the bonded member at the adhesive portion to form the semiconductor optical sensor element formed of a sensor chip and a light scattering chip; and
processing a surface of a glass flat plate through chemical etching or physical etching to form the light scattering portion of the transparent optical wafer.

12. The method of producing the semiconductor optical sensor element according to claim 11, further comprising the steps of forming a groove in the transparent optical wafer to expose the adhesive portion, and disposing a light blocking resin in the groove so that the light blocking resin remains on a side surface of the transparent optical wafer when the bonded member is cut with a dicing blade having a thickness smaller than a width of the groove.

13. The method of producing the semiconductor optical sensor element according to claim 11, further comprising the steps of forming a groove in the transparent optical wafer and the semiconductor wafer, and disposing a light blocking resin in the groove so that the light blocking resin remains on side surfaces of the transparent optical wafer and the semiconductor wafer when the bonded member is cut with a dicing blade having a thickness smaller than a width of the groove.

14. The method of producing the semiconductor optical sensor element according to claim 11, further comprising the step of blowing grinding particles against a surface of a glass flat plate with compressed air as physical etching to form an undulation surface as the light scattering portion of the transparent optical wafer.

15. The method of producing the semiconductor optical sensor element according to claim 11, further comprising the step of dissolving a surface of a glass flat plate with a hydrogen fluoride solution as chemical etching to form an undulation surface as the light scattering portion of the transparent optical wafer.

* * * * *